United States Patent
Carpenter

(10) Patent No.: US 6,597,184 B1
(45) Date of Patent: Jul. 22, 2003

(54) METHOD AND APPARATUS FOR ELECTROMAGNETIC EMISSIONS TESTING

(75) Inventor: Darren J Carpenter, Ipswich (GB)

(73) Assignee: British Telecommunications, London (GB)

(*) Notice: Subject to any disclaimer, the term of this patent is extended or adjusted under 35 U.S.C. 154(b) by 0 days.

(21) Appl. No.: 09/744,468

(22) PCT Filed: Aug. 23, 1999

(86) PCT No.: PCT/GB99/02768
§ 371 (c)(1),
(2), (4) Date: Jan. 25, 2001

(87) PCT Pub. No.: WO00/11483
PCT Pub. Date: Feb. 3, 2000

(30) Foreign Application Priority Data

Aug. 24, 1998 (EP) .......................................... 98306754
Sep. 24, 1998 (GB) .......................................... 9820838

(51) Int. Cl.⁷ .............................................. G01R 27/04
(52) U.S. Cl. ..................................... 324/632; 324/612
(58) Field of Search ........................... 324/72, 95, 260, 324/452, 612, 627, 632; 361/818; 455/575; 702/57

(56) References Cited

U.S. PATENT DOCUMENTS

| | | | | |
|---|---|---|---|---|
| 5,404,098 A | * | 4/1995 | Osburn | 324/95 |
| 5,534,772 A | * | 7/1996 | Rogers | 324/72.5 |
| 5,942,903 A | * | 8/1999 | Dafnzeisen et al. | 324/627 |
| 6,084,551 A | * | 7/2000 | Aslan | 343/725 |
| 6,154,178 A | * | 11/2000 | Aslan | 343/718 |
| 6,289,290 B1 | * | 9/2001 | Lee et al. | 702/57 |
| 6,363,333 B1 | * | 3/2002 | Deco et al. | 702/191 |
| 6,470,282 B1 | * | 10/2002 | Uesaka | 702/57 |

OTHER PUBLICATIONS

Takahashi et al.: "extrapolation of radiated emissions from telecommunication equipment" 1996 IEEE International conference on communications (ICC) converging technologies for tomorrow's applications Dallas, Jun. 23–27, 1996, vol. 3, Jun. 23, 1996, page.*
Communications, vol. 77, 1994, No. 11, New York.*
Aygun et al., "a two–level plane wave time–domain algorithm for fast analysis of EMC/EMI problems", IEEE transactions on electromagnetic compatibility, vol. 44, No. 1, Feb. 2002.*
Raghavan et al.: "emc value propositions for telecom products", Proceedings of INCEMIC 2001–2002.*
Bertocco et al.: "avirtual environment for EMC testing", IEEE International workshop on virtual and intellgent measurement systems Budapest Hungary, May 19–20, 2001.*

* cited by examiner

Primary Examiner—Christine Oda
Assistant Examiner—Walter Benson
(74) Attorney, Agent, or Firm—Nixon & Vanderhye, P.C.

(57) ABSTRACT

The likelihood of a system complying with EMC regulations is determined for a system comprised equipment units which individually radiate electromagnetic emissions. The intensity contribution of the electric field from each of the equipment units is calculated and a phase difference is randomly assigned to each of the components repeatedly in order to generate distribution of electric field values between a minium possible electric field value and a maximum possible electric field value. This distribution is then statistically analysed to determine a compliance probability.

25 Claims, 9 Drawing Sheets

METHOD AND APPARATUS FOR ELECTROMAGNETIC EMISSIONS TESTING

The present invention generally relates to the field of electromagnetic emissions testing. In particular the present invention relates to a method and apparatus for determining the likelihood of an electric field at a position and caused by electromagnetic emissions from a system a distance from the position being less than or more than a predefined electric field, where the system comprises a plurality of equipment units each of which individually radiate electromagnetic emissions.

There is a requirement for modern electrical and electronic equipment to meet a series of mandatory electromagnetic compatibility (EMC) requirements. One of the requirements is for the radiated electromagnetic emissions to be below a certain level in order to avoid interference to adjacent users of the radio frequency spectrum and other adjacent electrical and electronic equipment.

Certain electrical or electronic equipment is capable of being placed on a test facility whereupon the radiated electromagnetic emissions can be measured directly. Typically measurements are made at 3, 10, and 30 metres distance and the electronic fields at these distances are measured for vertical and horizontal polarities and for various radiation frequencies. The EMC regulations such as the European Union (EU) Directive 89/336/EEC which came into force on Jan. 1, 1996 sets field levels which must be met by both individual equipment units and systems comprising a plurality of equipment units.

Demonstrating compliance of equipment units is the responsibility of the body that makes the unit available for sale within the European market (either the manufacturer or the importer). Demonstrating the compliance of systems is the responsibility of the Systems Integretor or that body on whose behalf the system is bought into operation.

Whilst it is possible to place some equipment on a test facility and measure emissions whilst the equipment is operated, for larger systems and installations this may not just be impractical but also impossible. For example, the testing of the radiated emissions for a telephone exchange would require the complete telephone exchange to be placed on a test facility and it would be necessary to simulate typical operation of the exchange.

For this reason it is also possible in order to demonstrate compliance with the EMC regulations to generate what are termed Technical Construction Files (TCFs) for each system or installation. Under the terms of the EU Directive a TCF records all information relevant to the EMC performance of the item it concerns.

Using TCFs it is possible to demonstrate compliance with the EMC regulations by predicting the electromagnetic compatibility of the equipment and the present invention is concerned with a particular method of prediction that leasds the system owner to conflude that it complies with the protection requirements of the regulations.

In accordance with an aspect of the present invention there is provided a method of determining electromagnetic compatibility by predicting the likelihood of compliance with the radiated emissions standards. This is achieved by calculating the contribution to the electromagnetic field caused by emissions from equipment units forming the system and assigning a random relative phase to the components in order to build up a distribution of possible electromagnetic field values. This distribution can then be statistically analysed to determine the likelihood of compliance.

Thus for systems and installations which are comprised of large numbers of equipment units, the present inventor has realised that it is in principle possible to consider the field emitted from the system resulting from the combination of the emissions from the equipment units, if the following is known for each equipment unit: (I) the individually radiated electric field at the point of interest; (ii) the relative phase of the individually radiated electric fields at the point of interest. However, the relative phase of the emissions from the equipment units can not be accurately predicted. The inventor has overcome this problem by using a statistical technique whereby the relative phase of each contribution is randomised in order to determine a statistical distribution for the field emitted by the system. From this statistical distribution the likelihood of compliance with the standard can then be determined.

In one particular embodiment this statistical analysis technique comprises determining the cumulative probability for the electric field values and determining if, for the electric field threshold defined by the standard, the cumulative probability is above or below the threshold.

The statistical technique used in the present invention is considered to be a particularly valid one in view of the variability of emissions of the equipment due to both operating variations and manufacturing variations. In particular, in a publication The International Special Committee on Radio Interference, CISPR 22, 3rd Edition 1997-11, Section 7, Interpretation of CISPR Radio Distribution Limit, Sub-Section 7.1.2 it is stated "The significance of the limits for equipment shall be that, on a statistical basis, at least 80% of the mass produced equipment complies with the limits with at least 80% confidence".

In an embodiment of the present invention the relative phase is randomly selected in accordance with a predefined probability distribution of possible relative phases. Preferably, each possible relative phase has equal probability in the predefined probability distribution.

The individual electric field components generated by individual equipment units can be calculated based on the distances from the equipment units to the defined position and based on known electromagnetic emission properties of the equipment units. Such a known electromagnetic emission properties can either comprise a measured electric field at a distance from the equipment unit, or can be information which is provided with the equipment unit.

The electromagnetic emission from the units can be emitted at a plurality of frequencies and at various polarities. The method of determining the likelihood of compliance of the system with the standard can include determining the likelihood for each frequency and polarity e.g. vertical and horizontal polarities.

In an embodiment of the present invention the minimum possible compound electric field is determined using the individually calculated electrical field components and if the minimum possible compound electric field is greater than the predefined electric field, clearly the system cannot meet the standard and the statistical analysis is not carried.

The maximum possible compound electric field is determined using the individual calculated electric field components and if the maximum possible compound electric field is not greater than the predefined electric field, clearly the system cannot fail the standard and thus the statistical analysis need not be carried out. If the maximum possible compound electric field and the minimum possible compound electric field is less than the predefined electric field, is greater than the predefined electric field, the likelihood of the equipment complying with the standards must be determined.

Using the technique of the present invention, in an embodiment of the present invention it is possible to map around the system to provide "contours" of EMC compliance probability. This mapping may be important for example which considering an installation and its effect on its neighbours. For example, there may be highly sensitive equipment in the neighbourhood in one direction and thus in this direction the emissions will need to be reduced.

Using the method of the present invention it is thus possible to design a system which comprises a plurality of equipment units. Units can be arranged in dependence upon their emissions in order to meet the desired emission criteria. Such a method can be implemented on a computer to provide a graphical user interface allowing the user to move the units about within the model of the equipment.

The present invention can be implemented as a computer program operating on a standard computer and thus one aspect of the present invention provides a storage medium containing processor implementable instructions for controlling a processor to carry out the method. Another aspect of the present invention provides an electronic signal carrying computer code for instructing a processor to carry out the method.

Embodiments of the present invention will now be described with reference to the accompanying drawings in which:

FIG. 1 is a graph showing the CISPR 22: 1997 radiated field limits for information technology equipment (ITE)

FIG. 2 schematically illustrates the contribution to the compound electric field from equipment units forming a system such as a large installation;

Figure 1:
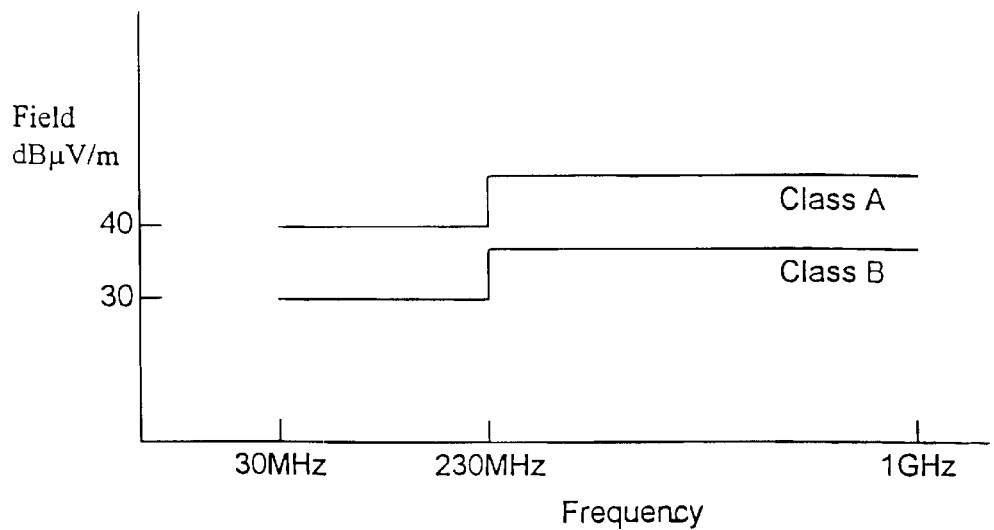
Figure 2:
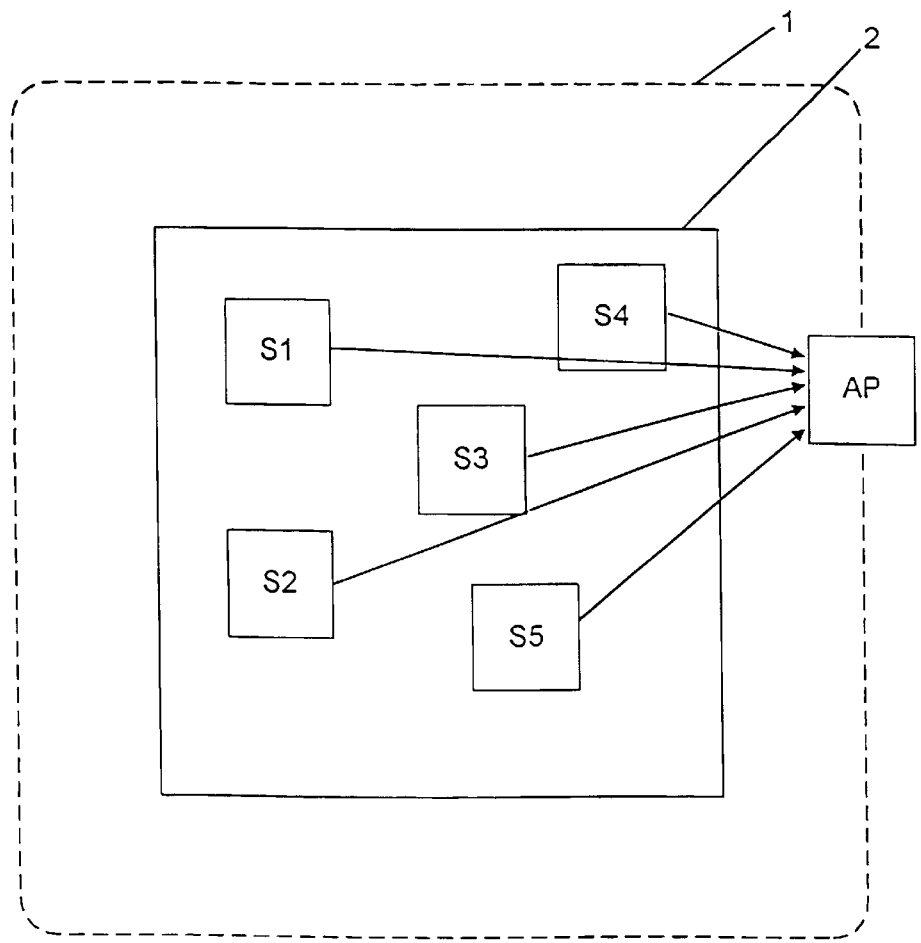

Referring to the drawings, FIG. 1 illustrates the CISPR 22: 1997 emissions limits in the frequency range 30 MHz to 1 GHz for class A equipment (industrial) environment and class B equipment (domestic light industrial) environment when measured at 10 metres from the equipment. FIG. 2 schematically illustrates a complex system such as a telephone exchange which comprises a number of equipment units which form sources S1 to S5 of electromagnetic emission e.g. switches. In order to meet the EMC regulations, at a specific distance such as 10 metres (indicated by the dotted line 1 in FIG. 2), the combined effect of the emissions of all of the sources S1 to S5 must be below the required levels. Thus as shown in FIG. 2 at an analysis point (AP) on the boundary 1 the combined effect of the emissions of the sources S1 to S5 must be determined.

Since for practical reasons in many instances these cannot be measured. The inventors have applied a method of predicting the resultant field.

The emissions of the equipment units forming the system 2 can be determined either for example by direct measurement, or from the information given by the manufacturers and/or suppliers. This information can give complete information for emissions over a range of frequencies and at different polarities. This information is usually required in order for the manufacturers and/or suppliers of the equipment units to themselves meet the EMC regulations.

Although information is thus available on electromagnetic emissions from the equipment units, in order for the resultant electric field at the analysis point (AP) to be calculated it is necessary to know both the intensity and phase of the electric field components contributing to the resultant field. There are two factors which effect these:

1. propagation distances; and
2. synchrocinity of generation of the electromagnetic emissions.

The propagation distances effect both the intensity and phase of the electromagnetic emission and the usual inverse rule can be used to determine the propagation loss and thus the intensity at the analysis point. Also, the propagation distances could be used to calculate the phase differences caused by propagation distances if the initial phase of the generated electromagnetic emission was known. However, the synchrocinity of generation can be extremely difficult, if at all possible, to derive since this can be varied both by thermal drift and by variations in switching for example in the equipment units.

Thus although the intensity of the electric field at a distance from the source can be determined from the equation below, the phase of the electric field s indeterminable.

$$E_2 = E_1 + 20 \cdot \log_{10}\left[\frac{r_1}{r_2}\right]$$

where $E_1$ is the electric field intensity measured at a distance $r_1$ from the source, and $E_2$ is the electric field intensity measured at a distance $r_2$ from the source.

If the worst case scenario is considered and all of the sources emit such that the emissions are in phase as they emit at the analysis point, then the electric field at the analysis point is simply given by summing the electric field components due to electromagnetic emissions from the sources S1 to S5. If this worst case electric field value is below the threshold electric field defined in the EMC standard, then clearly the equipment 2 can never fail the EMC standard. In this case the equipment 2 is 100% compliant with the EMC standard. If however, the maximum possible field at the analysis point exceeds the threshold field set by the standard, it is necessary to take into consideration the phase in order to be able to give a probability that the system will comply with the standard.

Figure 3:
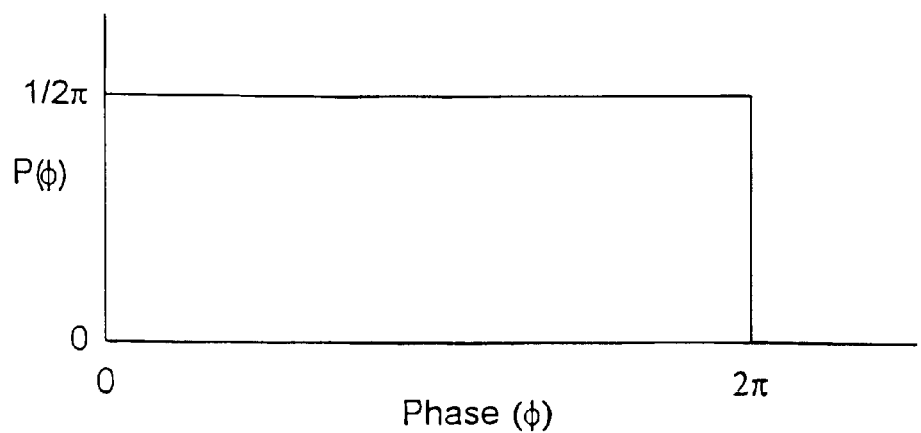
FIG. 3 is a graph illustrating the random probability density for the phase differences.

In the present invention the phase difference between each source is assumed to be unknown. A phase difference having a random probability distribution is used for assigning the phase difference between the emissions of the sources. Given that a random variable is able and equally likely to adopt any value within its specified, a random phase difference has a probability distribution as illustrated in FIG. 3. As can be seen in FIG. 3 the probability of a sources phase difference adopting any value is ½ π. To evaluate the combined electric field intensity at the analysis point, one of the emissions (generally the largest emission) is selected as the phase reference. Further emissions are free to adopt any phase difference with respect of this reference and are therefore referred to as "independent".

Figure 4:
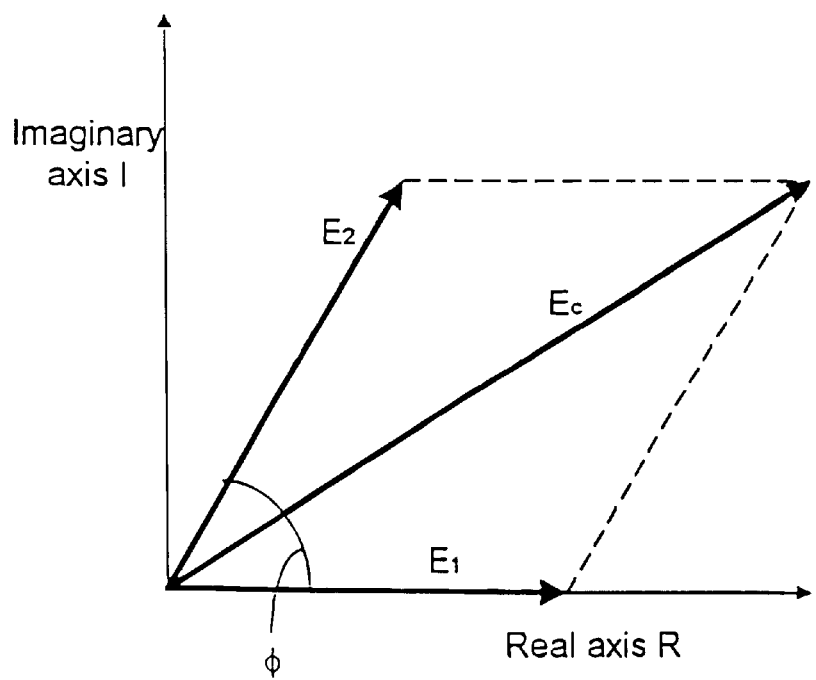
FIG. 4 is an Argand diagram illustrating the combination of electric field components.

FIG. 4 illustrates the calculation of the peak amplitude of the combined field values and comprises an Argand Diagram. In this diagram the reference phase field is given by $E_1$, the phase independent field is given by $E_2$ and the resultant field is given by $E_c$.

The peak amplitude of the combined field $E_c$ is given by Pythagorus as:

$$E_c = \sqrt{(E_r^2 + E_i^2)}$$

where $$E_r = E_1 + E_2 \cos \phi$$

$$E_i = E_2 \sin \phi$$

where $E_r$ and $E_i$ are the real and imaginary components peak amplitude of the combined field respectively.

Figure 5A:
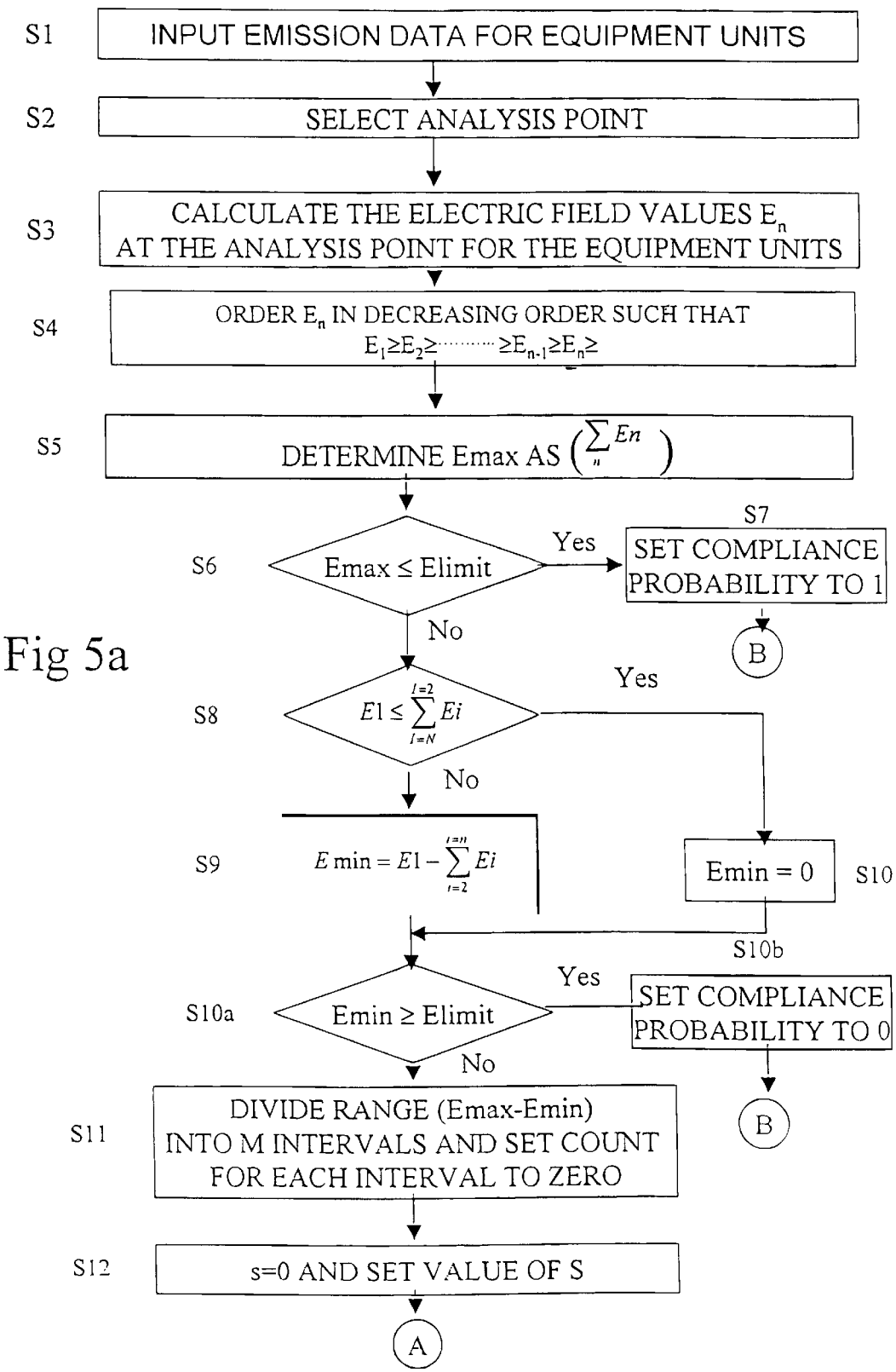
FIGS. 5a and 5b are a flow diagram illustrating the method of an embodiment of the present invention.
Figure 5B:
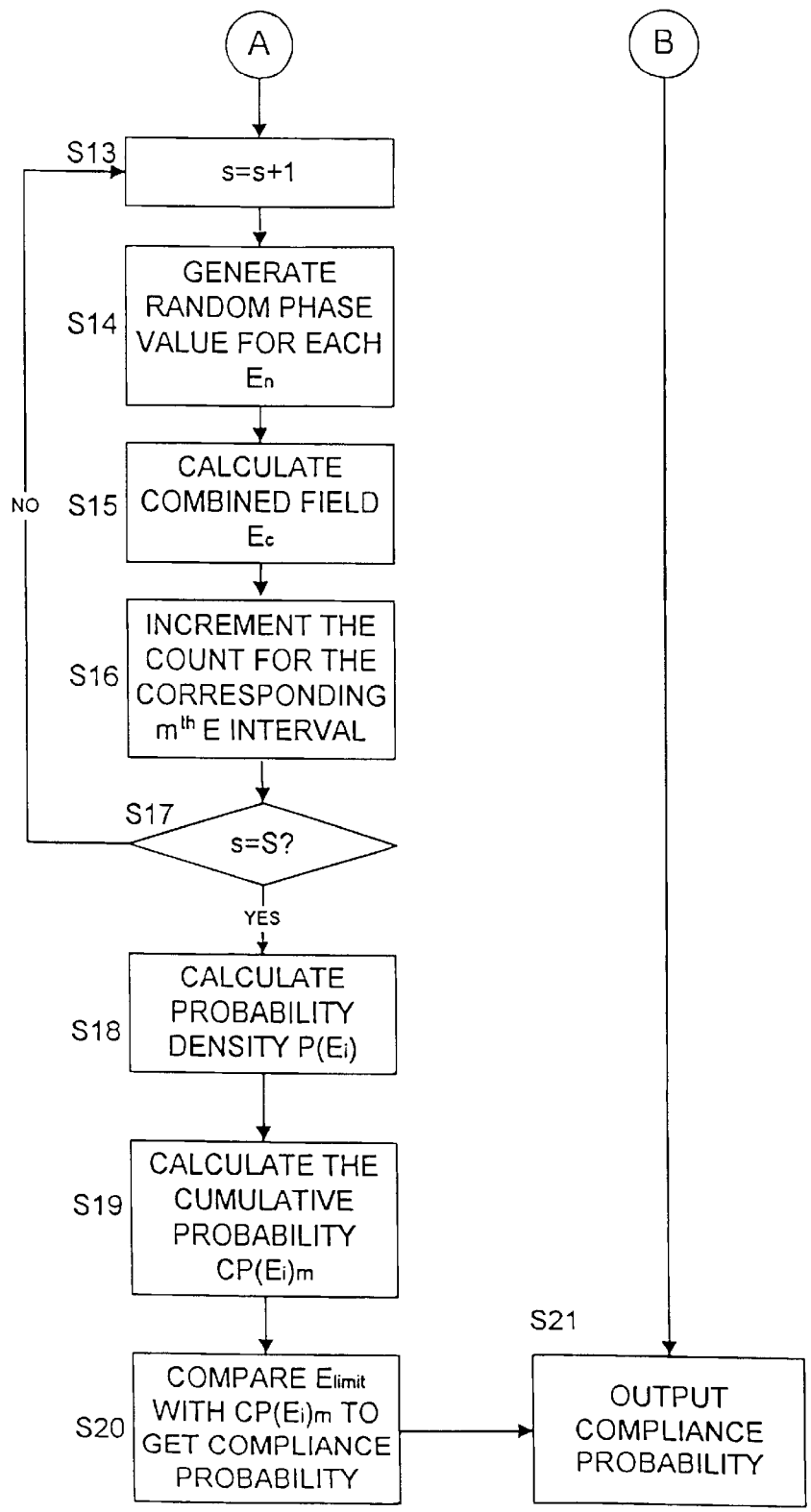

FIGS. 5a and 5b are a flow diagram illustrating the steps performed by the method in order to determine the compliance probability.

In step S1 the emission data for the equipment units of the system is input and in step S2 the analysis point is selected. The electric field values $E_n$ at the analysis point for the n equipment units are then calculated in step S3 and these are then ordered in descending order of magnitude (S4).

Hence $$E_1 \geq E_2 \geq \ldots \geq E_{n-1} \geq E_n$$

The maximum possible peak amplitude of the combined field at the analysis point is then determined in step S5 using:

$$E_{\max} = \sum_n E_n$$

Thus, the maximum possible electric field is merely the sum of all of the electric field components assuming that all are in the phase and constructively add.

In step S6 it is determined whether the maximum possible electric field is less than or equal to the threshold i.e. $E_{max} \leq E_{limit}$. If so in step S7 the compliance probability is set to 1 and the process proceeds to step S21 to output the compliance probability.

If $E_{max} > E_{limit}$, in step S8 the minimum combined electric field $E_{min}$ is then determined using:

$$E_{\min} = \left(E_r - \sum_n E_n\right) \text{ for } E_1 > \sum_n E_n$$

$$E_{\min} = 0 \text{ for } E \leq \sum_n E_n$$

It can be seen that the minimum field value is taken with reference to the first component field value since this is used as the phase reference.

As can be seen in step S9 it is determined whether the field value for the phase reference, $E_1$, is less than or equal to the sum of the remaining fields and if so, in step S10 the minimum field value $E_{min}$ is set to 0.

$E_{min}$ is then compared with $E_{limit}$ At Step S10a and if $E_{min}$ is greater than or equal to then the probability of compliance is et to zero at step S10b since the apparatus would be unable to fall within the EMI compliance value at the selected point.

In step S11 the range $E_{max}$ to $E_{min}$ is then divided into M intervals and a count for each interval is set to zero. The upper limit to the ith interval is stored within $E_i$. The count for the ith interval is stored within $C_i$. The process then enters a processing loop wherein step S12 the number of iterations S is set and a loop counter s is set equal to 0 to initiate the loop. In step S13 the loop counter s is incremented. In the first step in the processing loop a random phase value for each phase-independent electric field component (ie for $E_2$ through to $E_n$) is generated (S14) and then the corresponding peak amplitude of the combined field $E_c$ is calculated (S15). The combined field $E_c$ corresponding to this set of phase values is then calculated. The calculated combined field is then interrogated and the interval within which it falls is identified. The count for this interval is then incremented (S16). In step S17 it is then determined whether the processing loop has completed the required number of loops i.e. whether s=S and if not the process returns to step S13 where the loop counter is incremented. In an embodiment, in order to generate a significant statistical distribution, the loop is implemented 50,000 times i.e. S=50,000.

In step S18 the probability density $P(E_i)$ is calculated and in step S19 the cumulative probability $CP(E_i)_m$ is calculated. The calculated cumulative probability is then compared with the threshold field defined by the EMC regulations to get the compliance probability in step S20 which is then output (S21).

At the point of leaving the processing loop (S17) a histogram of the number of peak amplitude of the combined field values that fall within the M discrete intervals between $E_{min}$ and $E_{max}$ is generated as a row of numbers. In step S18 the probability density is calculated using:

$$P(E_i) = \frac{C_i}{S}$$

Figure 6:
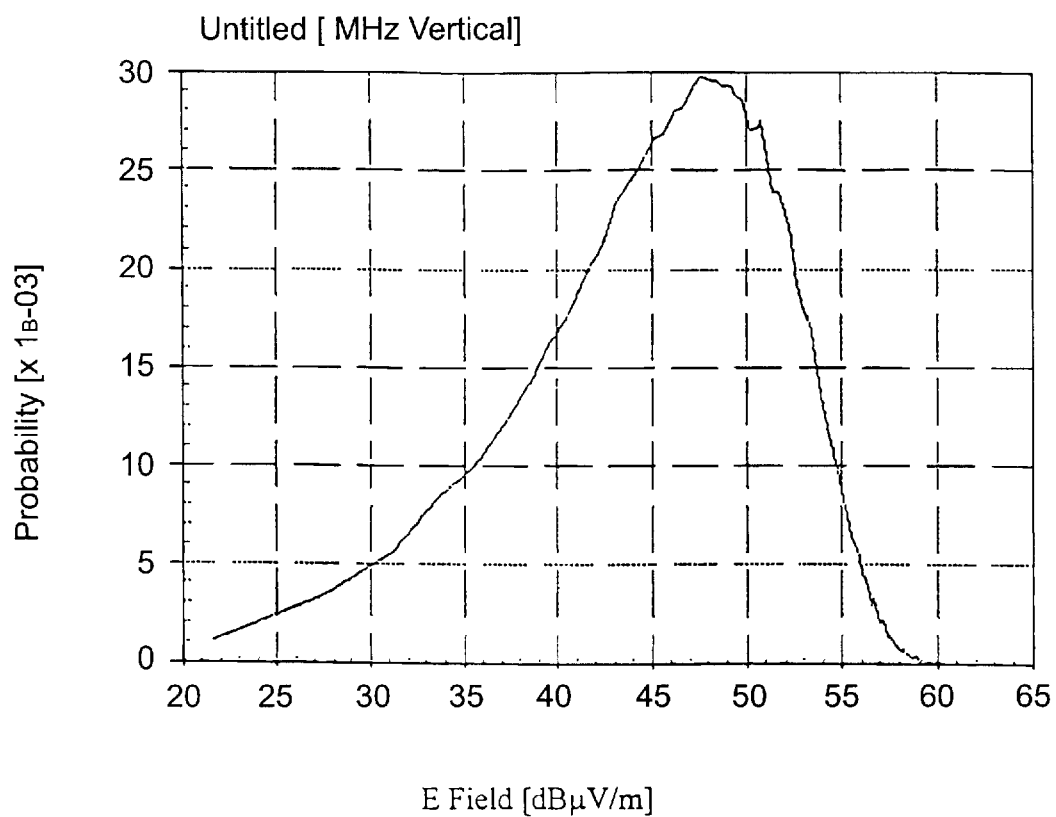
FIG. 6 is a graph showing the calculated probability distribution for electric field emitted by a complex system such as an installation.

FIG. 6 illustrates a calculated probability distribution. It can be seen that if the threshold field set by the EMC regulations is 60 dB$\mu$V/m, the system is 100% compliant since there is no probability that the field caused by emissions from the system can exceed the threshold field defined by the EMC regulations. If however, the EMC regulations defines a threshold field of 58 dB$\mu$V/m or less, there is a probability that the system will generate emissions sufficiently high enough to breach this threshold. The graph of FIG. 6 does not however, clearly identify what the likelihood of this occurring is.

In step S19 a cumulative probability is calculated using:

$$(CP(E_i))_m = \sum_{i=0}^{m} P(E_i)$$

where $E_i$ is the upper limit of the ith electric field component in the distribution, and m is a number of the electric field component in the distribution.

Figure 7:
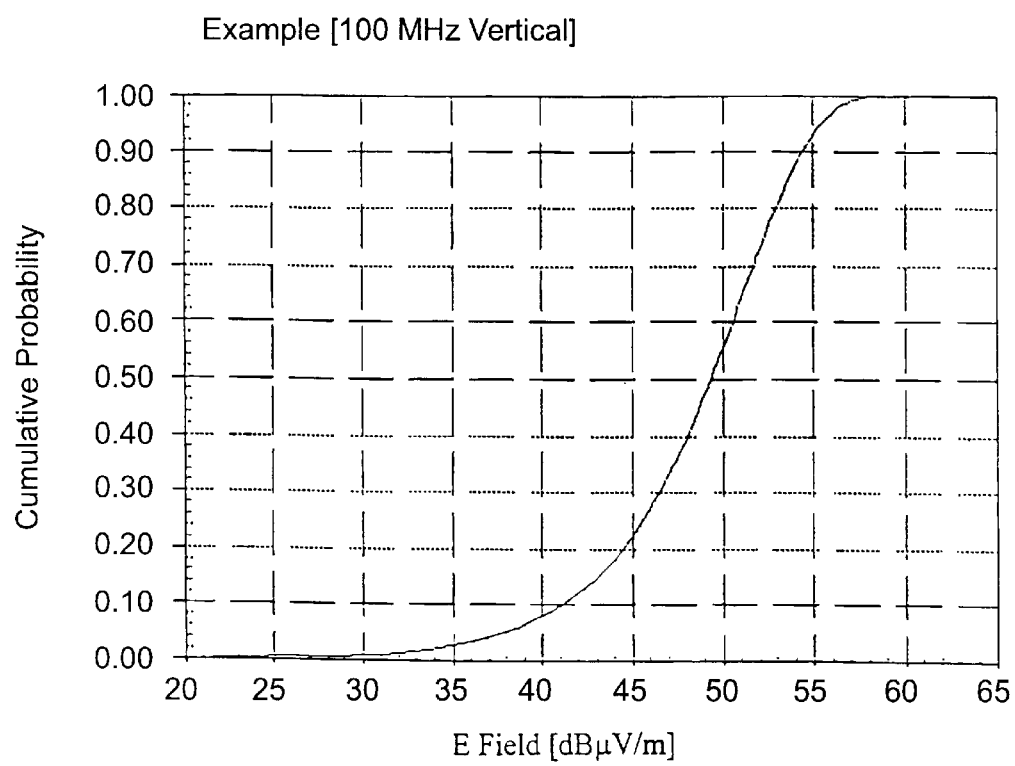
FIG. 7 is a graph illustrating the cumulative probability derived from the probability distribution in FIG. 6.

FIG. 7 illustrates the cumulative probability for the probability distribution of FIG. 6. As can be seen the cumulative probability indicates the likelihood of the system complying with the EMC regulations depending upon the threshold set by the regulation. For example, if the threshold set by the regulation is 30 dB$\mu$V/m, there is almost zero probability of the system complying. If the threshold is 60 dB$\mu$V/m, there is a 100% probability of the system complying. For EMC regulations which defines the threshold between these field values, the probability of compliance will depend upon the field threshold. For example, if the 80% rule is followed, as discussed hereinabove, the system would satisfy EMC regulations defining a threshold field of 53 dB$\mu$V/m.

Thus using the cumulative probability as illustrated in FIG. 7 as derived using the method of FIG. 4, by comparing the values with the threshold field of the EMC regulations, it is possible to generate a probability which indicates the probability of the system complying with the EMC regulations. This can be used to perform a risk analysis in order to take a commercial decision.

The method of FIG. 5 can be carried out for a range of frequencies and for a range of polarities such as vertically and horizontally in order to ensure compliance with the EMC regulations over the range of frequencies as shown in FIG. 1. Thus, the graph can be plotted of the compliance probability with respect to frequency. Further, as can be seen in FIG. 2, the compliance probability can be determined at a variety of analysis positions around the system 2 in order to provide a map of compliance probabilities at different positions and at difference distances.

The present invention can be implemented as two procedures in software on a computer. The two procedures can comprise a compliance probability calculation procedure and an interface procedure. The compliance probability calculation procedure can carry out the steps of FIGS. 5a and 5b. The interface procedure can provide a graphical interface to the user to allow the user to view a layout of the equipment units comprising the system 2 and the compliance probabilities as illustrated in FIG. 2. Also, the compliance probability can be illustrated in the graphical interface as a graph as shown in FIG. 7.

Figure 8:
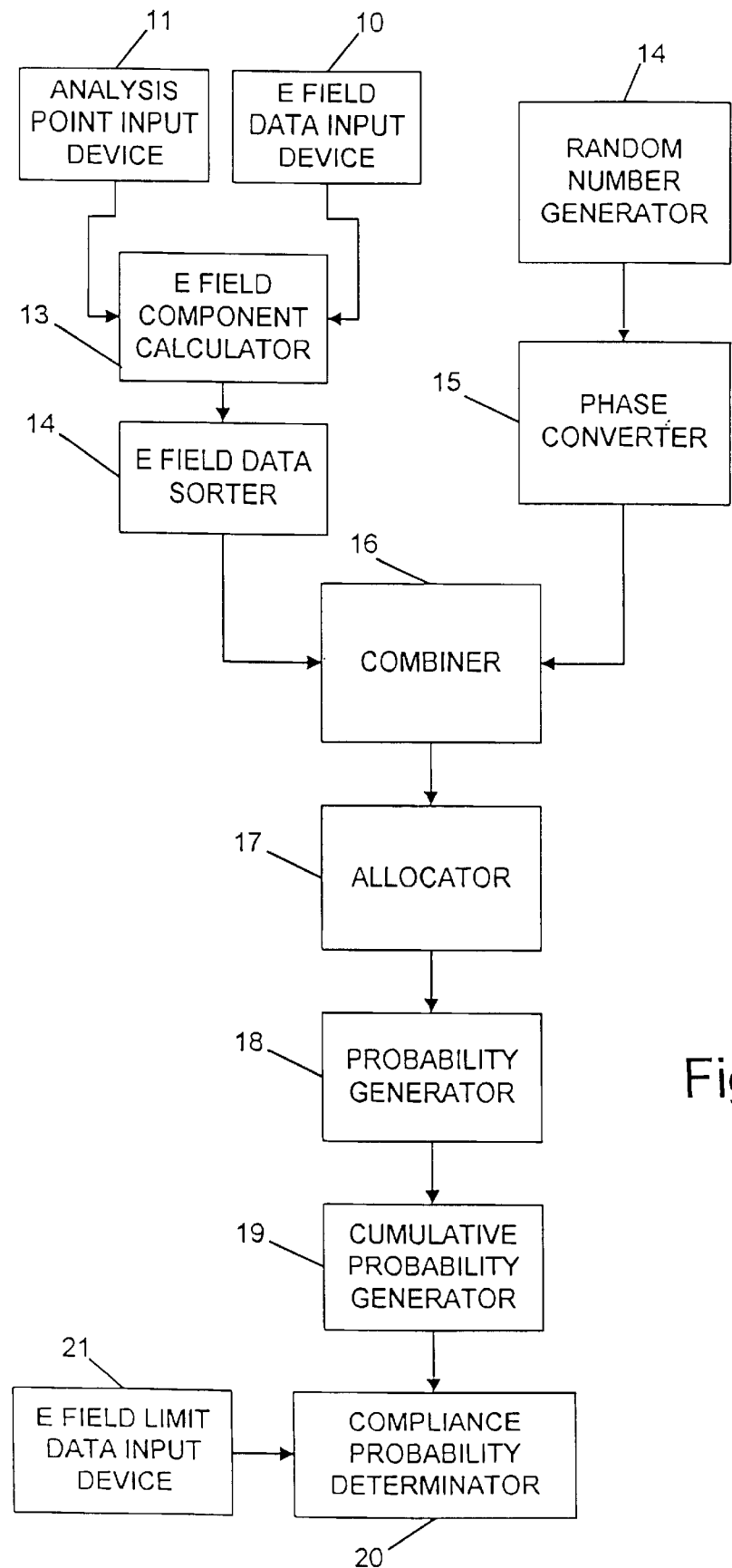
FIG. 8 is a functional diagram of apparatus in accordance with an embodiment of the present invention.

The apparatus for performing the method of FIGS. 5a and 5b is illustrated in FIG. 8 and comprises an electromagnetic field data input device 10 for receiving electromagnetic field data for each of the sources. An analysis point input device 11 allows a user to select the analysis point and this is used in an electric field component calculator 12 to calculate the electric field component contribution at the analysis point. The electromagnetic field data sorter 13 is provided to sort the electromagnetic field data into a descending order. The random number generator 14 generates a random number with equal probability which is then used by the phase converter 15 to convert this into a phase between 0 and $2\pi$. The generated phases are then combined with the respective electromagnetic field data in the combiner 16 to generate a combined electromagnetic field. The generated combined electric field is allocated to a particular memory location in dependence upon its value by the allocator 17 i.e. the histogram is built up. The probability generator 18 calculates a probability distribution using the histogram data and a cumulative probability generator 19 calculates the cumulative probability using the probability distribution. An electromagnetic field limit data input device 21 receives electromagnetic field limit data in dependence upon the electromagnetic compatibility regulations and this is input together with the cumulative probability into the compliance probability determinator 20 in order to determine a compliance probability.

Figure 9:
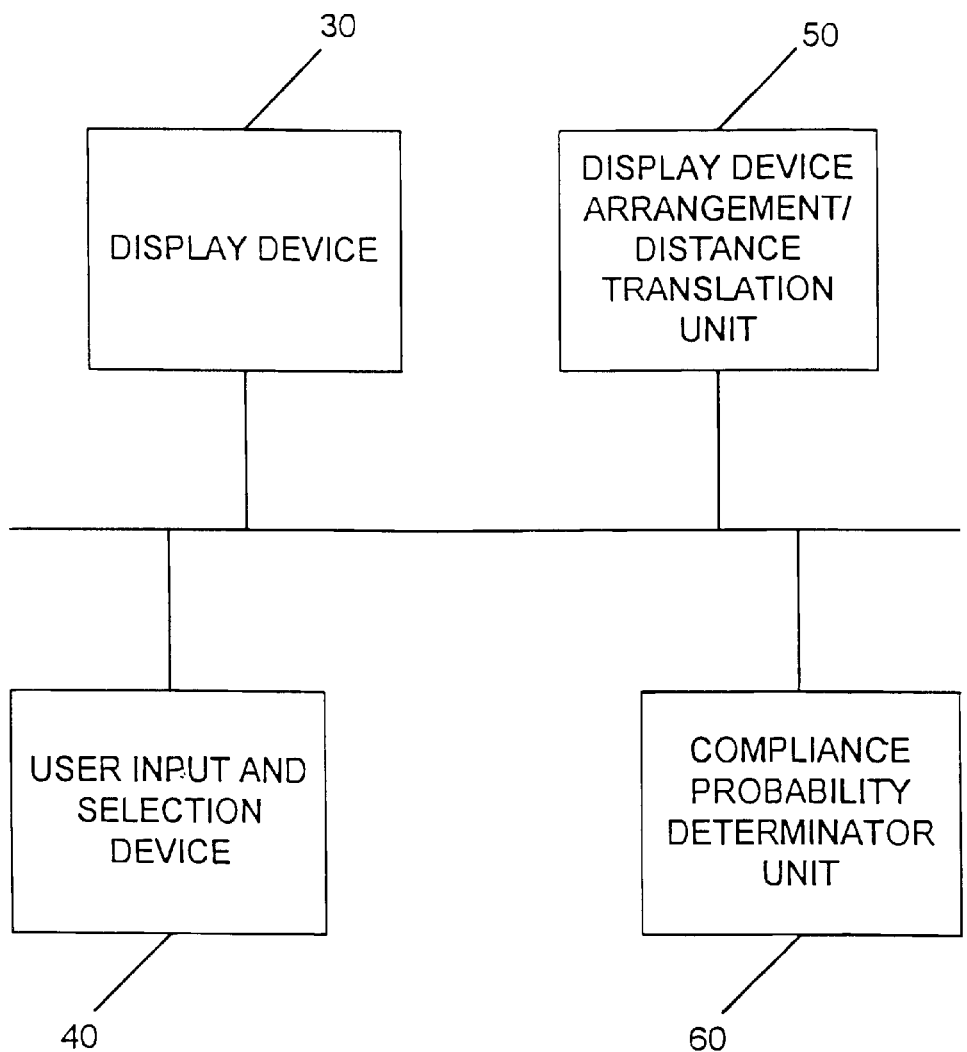
FIG. 9 is a schematic diagram of a design system incorporating the apparatus of FIG. 8 in accordance with an embodiment to the present invention.

FIG. 9 illustrates schematically apparatus for allowing a user to design a system to comply with the EMC regulations. A user interface is provided and comprises a display device 30 and a user input and selection device 40. A compliance probability determinator unit 60 is provided and comprises the apparatus of FIG. 8. Also a unit 50 for translating display arrangement of units into distance measurements is provided. Thus the apparatus in FIG. 9 can be operated by a user to move sources S1 to S5 in FIG. 2, using the user selection device and in this way selecting an appropriate arrangement of sources. The movement of sources may be carried out automatically and iteratively from a starting arrangement e.g. a random arrangement. The user can input individual data for each of the sources which can be used by the compliance probability determinator unit. Also, the unit 50 can translate the displayed arrangement into distances which can be used by the compliance probability determinator unit in order to determine the individual contributions to the field caused by each of the sources at any number of selected analysis points. In this way, the user is able to adapt the arrangement of equipment units within the system 2 in order to try to achieve the optimum arrangement for EMC compliance.

Figure 10:
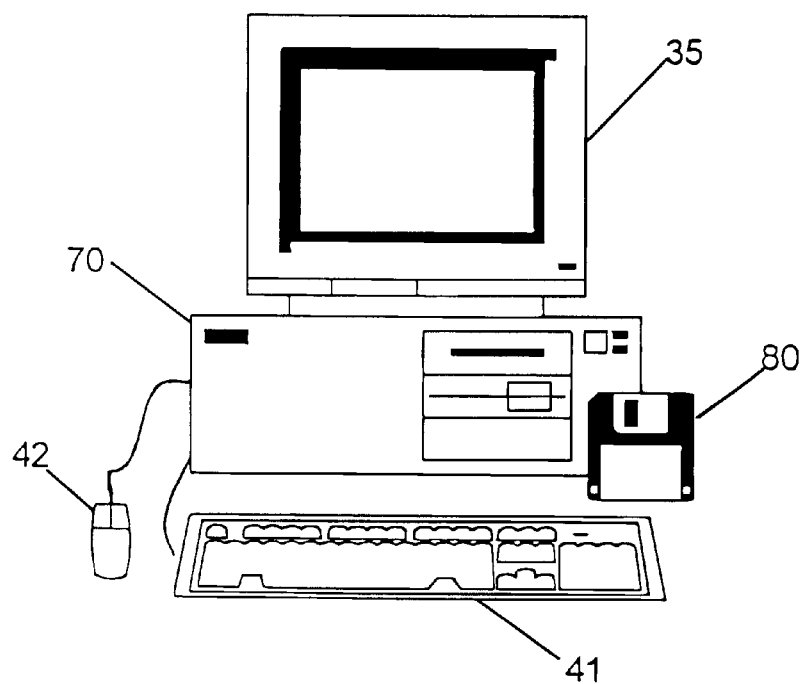

FIG. 10 illustrates a conventional computer 70 having a display device 35 for displaying the layout of the units in the equipment 2 and for displaying the compliance probabilities. The user is able to interface to the device using the keyboard 41 and the pointing device 42. The system can be implemented as a computer program provided on a magnetic media such as a floppy disk 80.

It can be seen from the embodiments of the present invention described hereinabove that the present invention provides a method of apparatus for determining the likelihood that a system comprised of individual equipment units will comply with EMC regulations. Further, the present invention allows the user to design the layout of equipment units within the system optimally for EMC compliance.

Although the present invention has been described hereinabove with reference to specific embodiments it would be clear to a skilled person in the art that modifications are possible within the spirit and scope of the present invention.

For the avoidance of doubt it is here noted that the system referred to in connection with the methods hereinbefore described may comprise a single circuit board, the referenced plurality of equipment units being the component parts of such a circuit board including individual tracks thereon. Thus the invention may be applied equally to determining the likelihood of an electric field at a position a distance from a printed circuit board and caused by electromagnetic emissions from such a circuit board being less than or more than a predetermined electric field where a plurality of components and/or printed circuit tracks of the circuit board individually radiate electromagnetic emissions.

It will also be noted that an equipment unit comprising a plurality of printed circuit boards may equally be considered as a system for the purposes of electromagnetic emissions testing.

What is claimed is:

1. A method of determining the likelihood of an electric field strength at a position and caused by electromagnetic emissions from a system at a distance from said position being less than or more than a predefined electric field strength, where the system comprises a plurality of equipment units each of which individually generates electromagnetic emissions, the method comprising:

determining the individual electric field components at said position resulting from radiated electromagnetic emissions from each said equipment unit;

defining a threshold maximum electric field strength;

summing the respective individual maximum electric field components to provide a maximum field strength value;

determining whether said maximum field strength value exceeds the threshold;

summing the respective individual minimum electric field components to provide a minimum field strength value if the maximum field strength value exceeds the threshold;

determining whether said minimum field strength value exceeds the threshold; and determining that the system cannot meet predefined requirements if the minimum field strength value exceeds the threshold, and otherwise, repeatedly assigning a random relative phase to the individual electric field components, and calculating a compound electric field at said position using the determined electric field components and said assigned phases to generate a distribution of compound electric field values; and statistically analysing said generated distribution to determine the likelihood of the electric field at said position caused by said electromagnetic emissions being less than or more than said predefined electric field strength.

2. A method according to claim 1, wherein the statistical analysis step comprises determining the cumulative probability for the compound electric field values, and determining if, for the predefined electric field, the cumulative probability is above or below the threshold.

3. A method according to claim 1, wherein the assigning step comprising assigning a relative phase randomly selected in accordance with a predefined probability distribution of possible relative phases.

4. A method according to claim 3, wherein each possible relative phase has equal probability in the predefined probability distribution.

5. A method according to claim 1 wherein the determining step comprises calculating the individual electric field components based on known electromagnetic emission properties of said equipment units and the distances from said equipment units to said position.

6. A method according to claim 5, wherein the known electromagnetic emission property for a said equipment unit comprises a measured electric field at a distance from the equipment unit.

7. A method according to claim 1 wherein said equipment units radiate electromagnetic emissions at a plurality of frequencies and/or at horizontal and/or vertical polarities, and the method includes determining the likelihood for each frequency and/or polarity.

8. A method according to claim 1 wherein said generated distribution comprises a histogram of the number of calculated compound electric field values that fall between a maximum possible compound electric field and a minimum possible compound electric field.

9. A method according to claim 1 including determining the maximum possible compound electric field using the individual calculated electric field components, wherein said repeated steps of assigning and calculating, and said statistical analysis step are only performed if the maximum possible compound electric field is greater than said predefined electric field, and said likelihood is determined to be high if said maximum possible compound electric field is less than said predefined electric field.

10. A method according to claim 1 including the steps of performing the method for a plurality of different said positions around said system to generate a map of likelihoods.

11. A storage medium storing processor implementable instructions for controlling a processor to carry out the method of claim 1.

12. An electronic signal carrying computer code for instructing a processor to carry out the method of claim 1.

13. A method of designing a system equipment comprising a plurality of equipment units each of which individually radiates electromagnetic emissions, the method comprising:

arranging the positions of said equipment units within a model of said system;

determining the likelihood of an electric field at a position and caused by electromagnetic emissions from said system a distance from said position being less than or more than a predefined electric field using the method of claim 1; and rearranging the positions of said equipment units within said model of said system in dependence upon the determination and repeating the determining step.

14. A method according to claim 13, wherein said determining step and the rearranging step are repeated to achieve a higher likelihood of the electric field at said position being less than said predefined electric field.

15. Apparatus for determining the likelihood of an electric field strength at a position and caused by electromagnetic emissions from a system at a distance from said position being less than zero more than a predefined electric field strength, where the system comprises a plurality of equipment units each of which individually radiates electromagnetic emissions, the apparatus comprising:

determining means for determining the individual electric field components at said position resulting from radiated electromagnetic emissions from each said equipment unit;

defining means for defining a threshold maximum electric field strength;

first calculating means for summing the respective individual maximum electric field components to provide a maximum field strength value and for summing the respective individual minimum electric field strength components to provide a minimum field strength value as needed;

comparison means for comparing said maximum field strength value with the threshold to determine whether said maximum field strength value exceeds said threshold and if so, determining whether said minimum field strength value exceeds the threshold and, if so, determining that the system cannot meet said predefined requirements and providing an output that indicates that the system cannot meet the predefined requirements;

phase means for repeatedly assigning a random relative phase to the individual electric field components;

second calculating means for calculating a compound electric field at said position using the determined electric field components and each repeatedly assigned phase for each individual electric field component to generate a distribution of compound electric field values; and statistical analysis means for statistically analysing said generated distribution to determine the likelihood of the electric field at said position caused by said electromagnetic emissions being less than or more than said predefined electric field strength.

16. Apparatus according to claim 15, wherein said statistical analysis means comprises means for determining the cumulative probability for the compound electric field values, and means for determining if, for the predefined electric, the cumulative probability is above or below a threshold.

17. Apparatus according to claim 15, wherein said phase means is adapted to assign a relative phase randomly selected in accordance with a predefined probability distribution of possible relative phases.

18. Apparatus according to claim 17, wherein said phase means is adapted to assign a relative phase randomly selected in accordance with a probability distribution where each possible relative phase has equal probability.

19. Apparatus according to claim 13, wherein said determining means is adapted to calculated the individual electric field components based on known electromagnetic emission properties of said equipment units and the distances from said equipment units to said position.

20. Apparatus according to claim 19 wherein said determining means is adapted to calculate the individual electric field components using the distances from said equipment units to said position and a measured electric field for each equipment unit at a distance from the equipment unit.

21. Apparatus according to claim 15, wherein said equipment units radiate electromagnetic emissions at a plurality of frequencies and/or at a plurality of polarities, the apparatus being adapted to determine the likelihood at each frequency and/or polarity.

22. Apparatus according to claim 15, wherein said second calculating means is adapted to generate said distribution as a histogram of the number of calculated compound electric field values that fall between a maximum possible compound electric field and a minimum possible compound electric field.

23. Apparatus according to claim 13, including means for calculating the maximum possible compound electric field using the individual determined electric field components; wherein said phase means, said calculating means and said statistical analysis means are adapted to only be operative if the maximum possible compound electric field is greater than said predefined electric field; and including means for determining said likelihood to be high if said maximum possible compound electric field is less than said predefined electric field.

24. Apparatus according to claim 15, wherein said apparatus is adapted to perform the determination of said likelihood for a plurality of said positions, and including means for generating a map of said likelihoods for said positions around said system.

25. Apparatus for designing a system comprising a plurality of equipment units each of which individually radiates electromagnetic emissions, the apparatus comprising:

means for arranging the portion of said equipment units within a model of said system;

the apparatus of claim 15 for determining a likelihood of an electric field at a position and caused by electromagnetic emissions from said system a distance from said position being less than or more than a predefined electric field; and means for rearranging the position of said equipment units within said model of said system following the operation of the determination apparatus, wherein the determining apparatus is operable to redetermine said likelihood.

* * * * *